United States Patent
Spanoche

(10) Patent No.: US 6,538,491 B1
(45) Date of Patent: Mar. 25, 2003

(54) METHOD AND CIRCUITS FOR COMPENSATING THE EFFECT OF SWITCH RESISTANCE ON SETTLING TIME OF HIGH SPEED SWITCHED CAPACITOR CIRCUITS

(75) Inventor: Sorin Andrei Spanoche, Santa Clara, CA (US)

(73) Assignee: Oki America, Inc., Sunnyvale, CA (US)

(*) Notice: Subject to any disclaimer, the term of this patent is extended or adjusted under 35 U.S.C. 154(b) by 0 days.

(21) Appl. No.: 09/669,769

(22) Filed: Sep. 26, 2000

(51) Int. Cl.⁷ .............................................. G06F 7/64
(52) U.S. Cl. ..................... 327/337; 327/344; 327/554; 327/95
(58) Field of Search .................... 327/336, 337, 327/341, 344, 345, 374, 378, 554, 561, 562, 94, 95; 380/9; 326/30

(56) References Cited

U.S. PATENT DOCUMENTS

| | | | | |
|---|---|---|---|---|
| 4,331,894 A | * | 5/1982 | Gregorian et al. | 327/95 |
| 4,393,351 A | * | 7/1983 | Gregorian et al. | 327/337 |
| 4,404,525 A | * | 9/1983 | Amir et al. | 330/9 |
| 4,484,089 A | * | 11/1984 | Viswanathan | 327/513 |
| 4,543,534 A | * | 9/1985 | Temes et al. | 330/9 |
| 4,644,304 A | * | 2/1987 | Temes | 333/173 |
| 4,754,226 A | * | 6/1988 | Lusignan | 327/356 |
| 4,894,620 A | * | 1/1990 | Nagaraj | 327/91 |
| 5,175,748 A | * | 12/1992 | Takahashi | 375/75 |
| 5,796,300 A | * | 8/1998 | Morgan | 330/9 |

OTHER PUBLICATIONS

Laker et al., "Design of Analog Integrated Circuits and Systems", McGraw Hill, 1994, p. 810.

Gregorian et al., "Switched-Capacitor Circuit Design", Proceedings of the IEEE, AUg. 1983, vol. 71, No. 8, pp. 187–212.

* cited by examiner

*Primary Examiner*—Timothy P. Callahan
*Assistant Examiner*—Hai L. Nguyen
(74) *Attorney, Agent, or Firm*—Volentine Francos, PLLC

(57) ABSTRACT

A switched capacitor circuit includes an operational transconductance amplifier, a feedback stage having a first switched capacitor and a first time constant, and a load stage having a second switched capacitor and a second time constant. The first time constant and the second time constant are equal to each other to improve settling of the circuit. The first and second switched capacitors are coupled to an output of the operational transconductance amplifier via transistors. The transistors are sized so that the time constants of the feedback and load section are equal. In a further embodiment, the time constant of the feedback section is made greater than the load section, to further improve settling. On-state resistance of the transistors are controlled with respect to transconductance of the operational transconductance amplifier to maintain smaller error.

23 Claims, 14 Drawing Sheets

US 6,538,491 B1

METHOD AND CIRCUITS FOR COMPENSATING THE EFFECT OF SWITCH RESISTANCE ON SETTLING TIME OF HIGH SPEED SWITCHED CAPACITOR CIRCUITS

BACKGROUND OF THE INVENTION

1. Field of the Invention

The present invention relates to methods and circuits for compensating the effect of switch resistance on settling time of high speed switched capacitor circuits.

2. Description of the Background Art

With the advent of MOS sub-micron technology circuits that function at low supply voltages, analog circuits must be implemented with minimal voltage headroom. An important class of analog circuits is based on the switched capacitor principle. These circuits include sample and hold circuits, track and hold circuits, switched capacitor amplifiers, switched capacitor filters, analog to digital converters (ADCs), chopper based circuits, and the like, and are used in most analog front-end solutions for mixed signal integrated circuits. In CMOS technology, such circuits are usually based on an interconnection of operational transconductance amplifiers (OTA) and capacitors by means of switches. Examples of conventional switched capacitor circuits can be found in *Proceedings of the IEEE*, "Switched-Capacitor Circuit Design" by Gregorian et al. (vol. 71, no. 8, pp 941–966, August 1983) and *Design of Analog Integrated Circuits* by Laker et al. (McGraw Hill, 1994, p 810). The need to design these switched capacitor circuits and use all available speed from a certain technology leads to both OTA and switch optimization within the limited voltage budget.

One of the figures of merit for these discrete-time analog processing circuits is the output settling time within a predefined error. The value of the output settling time dictates or limits some of the most important performance figures of these circuits, such as sampling frequency, harmonic distortion, signal to noise and distortion ratio, effective number of bits, signal processing bandwidth, etc.

The on-resistance of the switches connected in series with the switched capacitors create parasitic poles that adversely impact the settling performance of these circuits. The low supply voltage (low gate overdrive voltage) leads to higher switch on-resistance and degrades settling performance. In order to reduce the on-resistance, larger width transistors can be used. However, such larger width transistors increase both parasitic capacitance and clock feed-through, thus degrading settling performance. There is therefore a need to compensate the adverse effect of switch resistance on settling time.

A conventional approach to the problem of reducing the adverse effects of switch resistance on settling time includes using NMOS transistor based switches that connect plates of the switched capacitors to lower voltage nodes, so that the voltage gate overdrive is large enough and constant. All remaining switches of the circuit are CMOS transistor based switches. The sizes of the various transistors are determined assuming that the bandwidth of the switches and the capacitors together is much higher than the bandwidth of the OTAs and the capacitors. When voltage and speed are not limiting factors, the sizes of the MOS transistors are kept to a minimum and are usually constant throughout the design.

For example, FIG. 1 illustrates a conventional switched-capacitor circuit including OTA 400 and NMOS transistors that couple plates of the circuit capacitors to lower voltage nodes, or the ground potential in this instance. The circuit includes capacitor 411 having a first plate that is coupled to the inverting input of OTA 400 and that is also coupled to a first end of NMOS transistor 403. Capacitor 411 also has a second plate that is coupled to a first end of NMOS transistor 401, wherein second ends of NMOS transistors 401 and 403 are coupled to system ground. The second end of NMOS transistor 403 is also coupled to the non-inverted input of OTA 400. The second plate of capacitor 411 is also coupled to a first end of CMOS switch 423, which is illustrated in greater detail in FIG. 1A. The second end of CMOS switch 423 is coupled to a previous stage of the switch-capacitor circuit that is not illustrated.

The conventional switched-capacitor circuit of FIG. 1 further includes CMOS switch 425 having a first end that is coupled to the output of OTA 400 and a second end that is coupled to a first plate of capacitor 413. NMOS switch 405 has a first end that is coupled to the first plate of capacitor 413 and a second end that is coupled to system ground. A second plate of capacitor 413 is coupled to the inverting input of OTA 400, to complete a feedback path.

As further illustrated in FIG. 1, the next stage of the switched-capacitor circuit includes CMOS switch 427 having a first end that is coupled to the output of OTA 400 and having a second end that is coupled to a first plate of capacitor 415. NMOS switch 407 includes a first end that is coupled to a second plate of capacitor 415 and includes a second end that is coupled to system ground. The gates of NMOS transistors 401, 403, 405 and 407 and the gates of CMOS switches 423, 425 and 427 are typically driven by a control circuit that is not illustrated in FIG. 1. A primary disadvantage of a switched-capacitor circuit of this type is that the circuit is not appropriate for high speed operation due to large parasitic capacitance that is added to the circuit nodes by the CMOS switches.

If the relatively slower speed of the conventional circuit as described with respect to FIG. 1 can not be tolerated, the extra capacitance added by the slow and large PMOS transistors of CMOS switches 423, 425 and 427 and the extra capacitance added by the interconnect capacitance of the CMOS switches, must be reduced. Thus, a second conventional approach comprises eliminating the PMOS transistors of CMOS switches 423, 425, and 427 of the FIG. 1 circuit. The CMOS switches are respectively replaced with NMOS transistors 417, 419 and 421 as illustrated in FIG. 2, such that the circuit includes only NMOS transistor switches. Specifically, the circuit of FIG. 2 is configured the same as the circuit of FIG. 1, except for NMOS transistor 417 that includes a first end that is coupled to the second plate of capacitor 411 and a second end that is coupled to the previous stage, NMOS transistor 419 that includes a first end that is coupled to the output of OTA 400 and a second end that is coupled to the first plate of capacitor 413, and NMOS transistor 421 that includes a first end that is coupled to the output of OTA 400 and a second end that is coupled to the first plate of capacitor 415.

The approach of the FIG. 2 circuit has the advantage that only fast NMOS transistors are used for switches. However, a primary disadvantage of this approach is that the dynamic range of the circuit is reduced. Moreover, the sizes of the MOS transistors are determined by keeping the switch bandwidth much higher than the OTA bandwidth. As a result, the sizes of the switches must necessarily be large, so that even at high input or output voltages (low switch gate overdrive voltage), the switch bandwidth is much higher than the OTA bandwidth. This approach leads to a much tighter compromise between the dynamic range at the output of the circuit and the settling time at the output of the circuit.

To overcome the above-noted problems of the conventional all-NMOS switch circuit as illustrated in FIG. 2, the gate overdrive voltage for the switch transistors can be increased by means of an on-chip voltage multiplier. There are two conventional alternatives to this approach. In a first alternative as illustrated in FIG. 3, voltage multiplier 431 and level shifters 433 are implemented to ensure that the switch control voltage of the NMOS switches are constant and higher than the supply voltage Vdd. The circuit of FIG. 3 is configured the same as the circuit of FIG. 2, except for level shifters 433 that drive the gates of NMOS transistors 401, 403, 405, 417 and 419, and except for voltage multiplier 431 which multiples supply voltage Vdd and provides the higher multiplied voltage to level shifters 433.

According to a second alternative as illustrated in FIG. 4, charge pump circuits 441 and 442 are implemented so that the switch control voltage follows the switched node voltage (i.e. the switch gate overdrive voltage has a large and constant value). The circuit of FIG. 4 is configured the same as the circuit of FIG. 2, except for charge pump circuit 442 that is coupled to the output of OTA 400 and that provides the switch gate overdrive voltage to NMOS transistor 419, and except for charge pump circuit 441 that is coupled to the second end of NMOS transistor 417 and that provides the switch gate overdrive voltage to NMOS transistor 417. However, the voltage multiplier approaches as exemplified in FIGS. 3 and 4 have disadvantages which include increasing circuit area, increasing power requirements particularly in view of the charge pumps, and potentially reducing production yield due to higher on-chip voltages. Also, the charge pumps and voltage multipliers contribute to an increase in injected switching noise.

A still further conventional approach useful for very low supply voltage is based on the observation that the high swing nodes are usually at the output of the OTAs. Instead of using switches at the output in series with capacitors, the switched OP-AMP approach is based on using circuit topologies that allow for cutting the output stage of the OTA and short-circuiting this node to ground, as illustrated in FIG. 5. Specifically, using similar elements and notations as in FIG. 2 for simplicity of description, the conventional circuit of FIG. 5 includes OTA 400, NMOS transistor 403, and capacitors 411 and 413 configured as previously. However, the first end of capacitor 413 is directly coupled to the output of OTA 400, and NMOS transistor 419 and the remaining elements of FIG. 2 not specifically mentioned are not implemented in the circuit of FIG. 5. NMOS transistor 429 includes a first end that is coupled to the output of OTA 400 and a second end that is coupled to ground, and NMOS transistor 429 serves to short-circuit the output stage of OTA 400 to ground.

This solution as described with respect to FIG. 5 has the advantage of eliminating the output series switch that is a limiting factor for a large class of switched capacitor circuits. However, the switched OP-AMP approach is mainly targeted for very low supply voltages and lower speed. This is due to the fact that the whole OTA output stage is switched, including transistors with high current density. This operation can take a long period of time because a large stored charge needs to be eliminated during on to off switching of the circuit.

SUMMARY OF THE INVENTION

The present invention is therefore directed to a circuit and method for improving settling of switched-capacitor circuits, which substantially overcomes one or more of the problems due to the limitations and disadvantages of the related art.

To solve the above noted problems, it is an object of the present invention to provide a circuit including an operational transconductance amplifier having an input terminal and an output terminal, the operational transconductance amplifier amplifies a signal provided at the input terminal and provides an amplified signal at the output terminal; a feedback section that provides a feedback signal to the input terminal based on the amplified signal, the feedback section including a first switched capacitor and having a first time constant; and a load section that provides the amplified signal as an output of the circuit, the load section including a second switched capacitor and having a second time constant, the first time constant matching the second time constant to improve settling of the circuit.

In a preferred embodiment, the first and second switched capacitors are coupled to the output terminal of the operational transconductance amplifier by respective transistors, wherein channel widths and lengths of the transistors are sized so that the first time constant and the second time constant are matched. In a further preferred embodiment, the transistors are NMOS transistors.

It is a further object of the present invention to provide a method of improving settling of a circuit including an operational transconductance amplifier, a feedback stage having a first switched capacitor and a load stage having a second switched capacitor, the method including matching a time constant of the feedback stage and a time constant of the load stage.

In a preferred embodiment of the method of improving settling, the first and second switched capacitors are coupled to an output of the operational transconductance amplifier by respective transistors, wherein the matching comprises providing the transistors as having channel widths and lengths that are sized so that the first and second time constants are matched. In a further preferred embodiment, the transistors are NMOS transistors.

It is a still further object of the present invention to provide a circuit comprising an operational transconductance amplifier, a feedback section and a load section, wherein the first time constant of the feedback section is greater than the second time constant of the load section, to improve settling of the circuit. In a preferred embodiment of the circuit, resistance of the transistors in an on-state is controlled based on transconductance of the operational transconductance amplifier. In a still further preferred embodiment the transistors are NMOS transistors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 3:
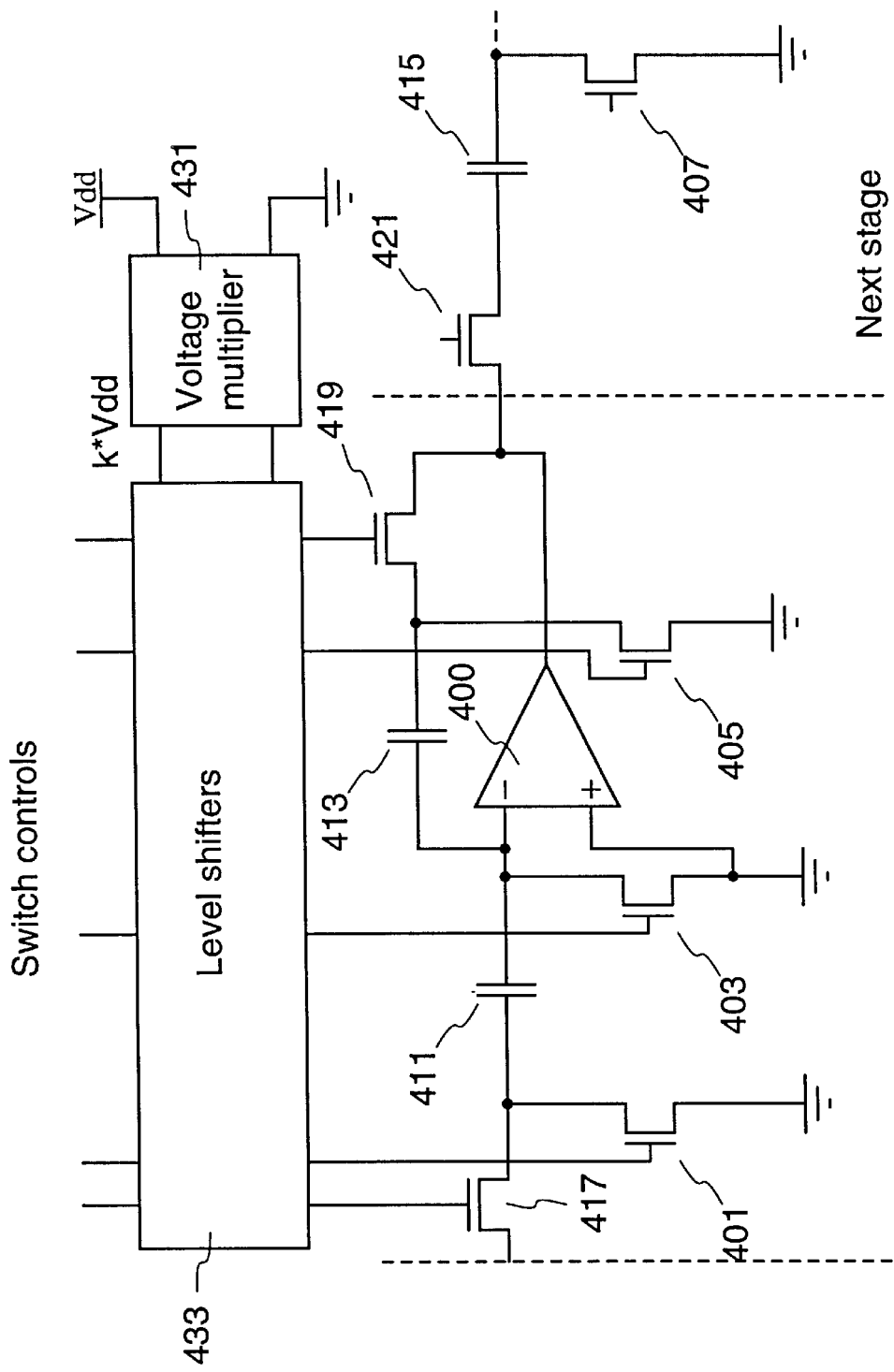
FIG. 3 illustrates a conventional all NMOS switched-capacitor circuit including a voltage multiplier and level shifters for providing the switch control voltages.
Figure 4:
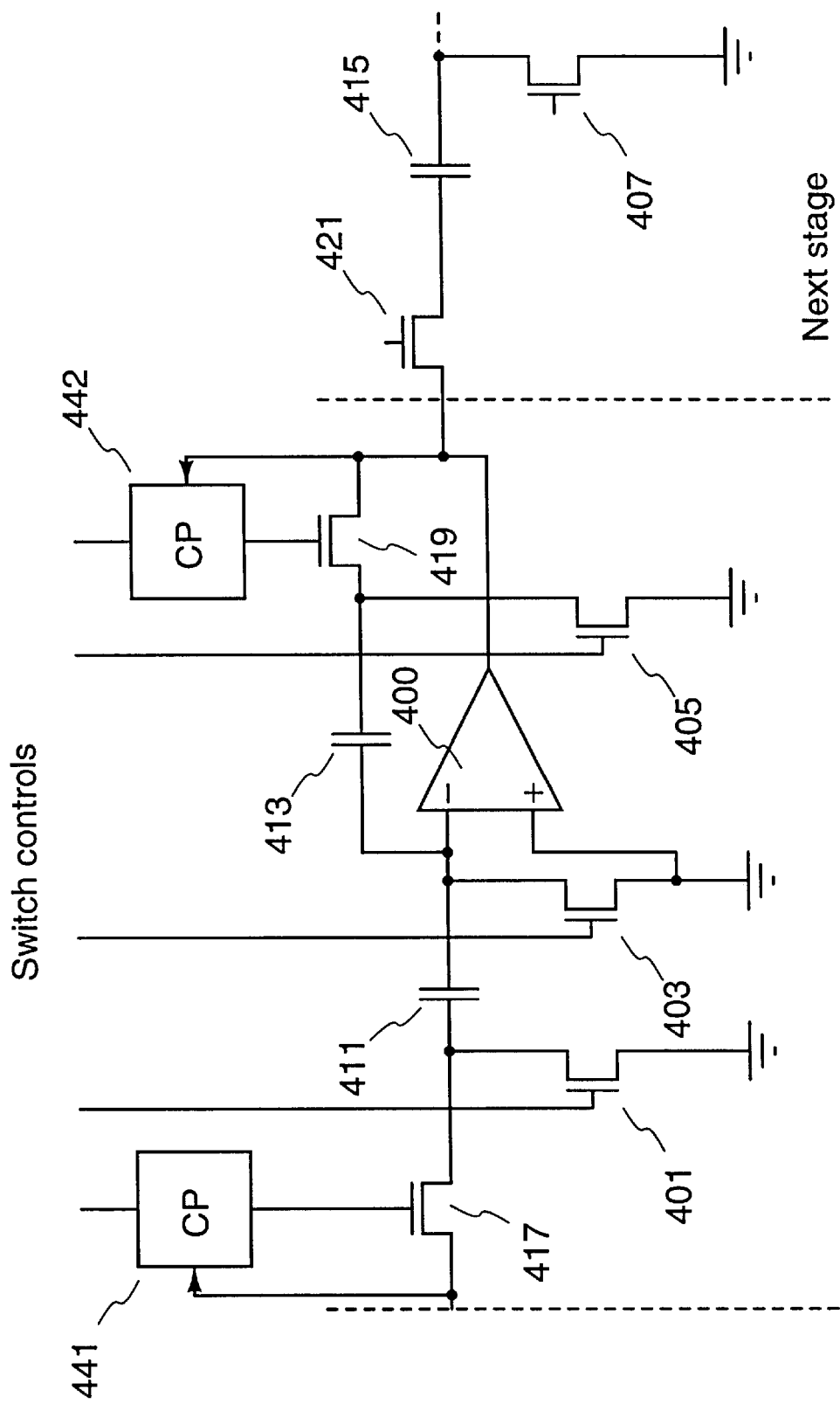
FIG. 4 illustrates a conventional all NMOS switched-capacitor circuit including charge pumps for providing the switch control voltages.
Figure 6:
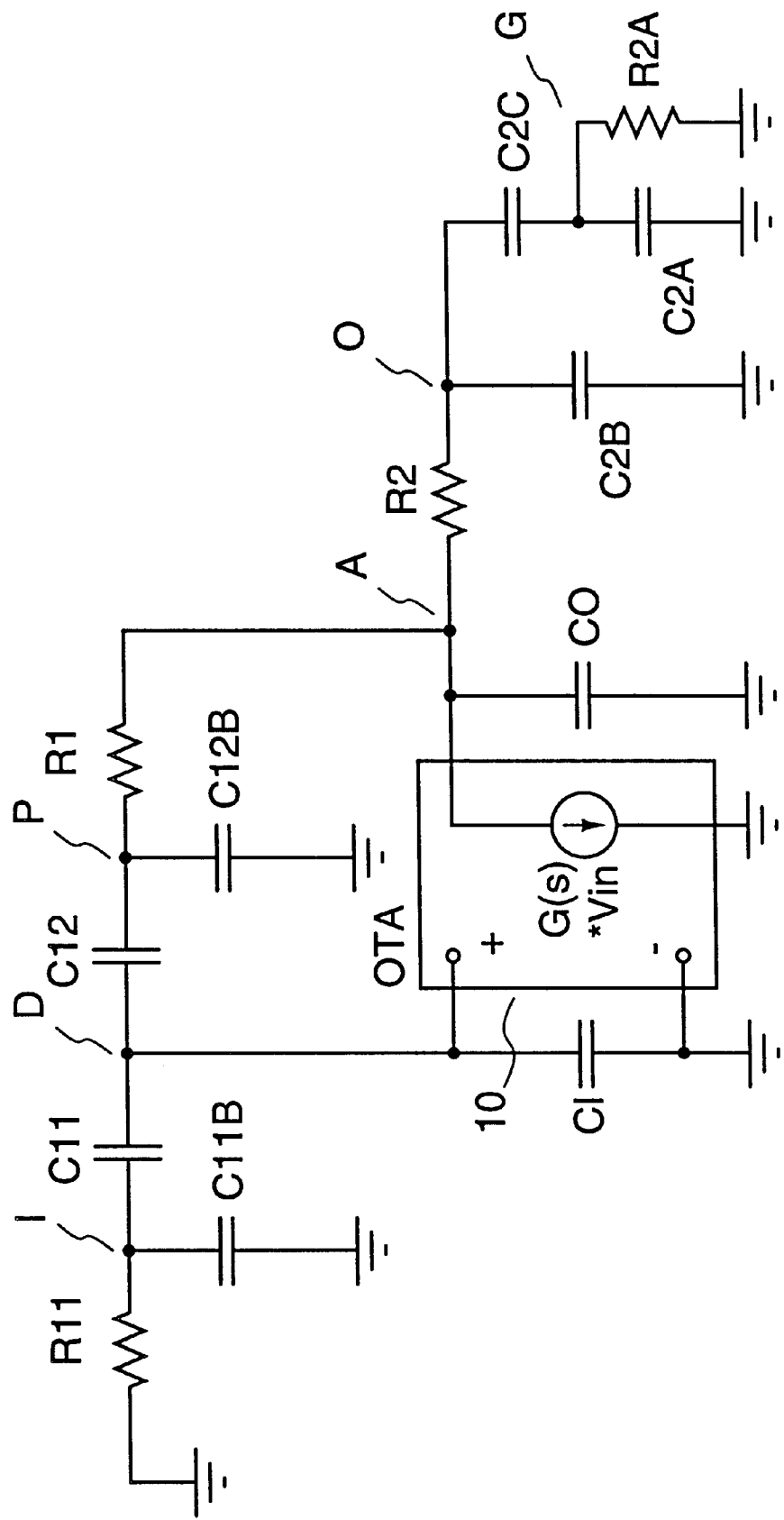
FIG. 6 illustrates a switched-capacitor circuit of a preferred embodiment including an operational transconductance amplifier that is in the output settling phase and with NMOS switches symbolically represented by resistors.

An example of a class of analog circuits of a preferred embodiment of the present invention is illustrated in FIG. 6, and includes an operational transconductance amplifier (OTA) interconnected with capacitors via switches. In FIG. 6, NMOS switches as described previously with respect to FIGS. 2–4 are used, and the NMOS switches are symbolically represented in ON states as resistors R. The following analysis described with respect to FIG. 6 assumes a general topology for the output of a switched capacitor stage that is in the output-settling phase. For simplicity, the differential mode circuit is analyzed.

As described, all the NMOS switches of the circuit of FIG. 6 are symbolically represented in an ON state as resistors. The circuit includes OTA 10 having a non-inverted input thereof coupled to OTA input node D and an output thereof coupled to OTA output node A. Capacitor CI has first and second plates respectively coupled to the non-inverted and inverted inputs of OTA 10. The inverted input of OTA 10 is also coupled to ground. Input node I of the circuit is provided between a first end of resistor R11 and a first plate of input capacitor C11. Resistor R11 has a second end coupled to ground and capacitor C11 has a second plate connected to OTA input node D. Resistor R11 short-circuits input capacitor C11 to ground. Capacitor C11B has a first plate coupled to input node I and a second plate coupled to ground.

A feedback network is provided between OTA output node A and the input of OTA 10. A first plate of capacitor C12 is coupled to OTA input node D. A second plate of capacitor C12, a first plate of capacitor C12B and a first end of resistor R1 are coupled together at node P. A second plate of capacitor C12B is coupled to ground. A second end of resistor R1 is coupled to OTA output node A. The feedback network thus includes capacitors C11, C12, CI and C12B.

The output stage of OTA 10 includes capacitor CO having a first plate coupled to OTA output node A and a second plate coupled to ground. Resistor R2 has a first end coupled to OTA output node A. A second end of resistor R2 and a first plate of capacitor C2B are coupled to circuit node O. A second plate of capacitor C2B is coupled to ground. A first plate of capacitor C2C is coupled to circuit node O and a second plate of capacitor C2C is coupled to circuit node G. A first plate of capacitor C2A and a first end of resistor R2A are coupled to circuit node G. A second plate of capacitor C2A and a second end of resistor R2A are coupled to ground. Incidently, capacitors C11B, C12B, CI, CO, C2B and C2A are lumped versions of bottom plate and other parasitic capacitors related to the OTA input node D and OTA output node A.

The transconductance of the OTA is generally a function of frequency and is described by the G(s) transfer function. The resistances of switches R11 and R2A can be neglected because their value is constant and can be made small (the switches connect nodes I and G to ground). The only switches that are important in this analysis are switches R1 and R2, which are connected to OTA output node A. This is because OTA output node A and circuit nodes P and O are the only nodes that can reach large voltage values during the settling process. The overdrive gate voltage for switches R1 and R2 is ($V_{dd}-V_A$), wherein $V_{dd}$ is the supply voltage. As a consequence, switches R1 and R2 will have a low overdrive voltage and high series resistance. Also, the position of switches R1 and R2 as each being tied to the OTA output node A is favorable because the resistance of switches R1 and R2 will have values that track each other (equal overdrive gate voltage), thus keeping their ratio constant and determined only by the geometry of the switches.

Figure 7:
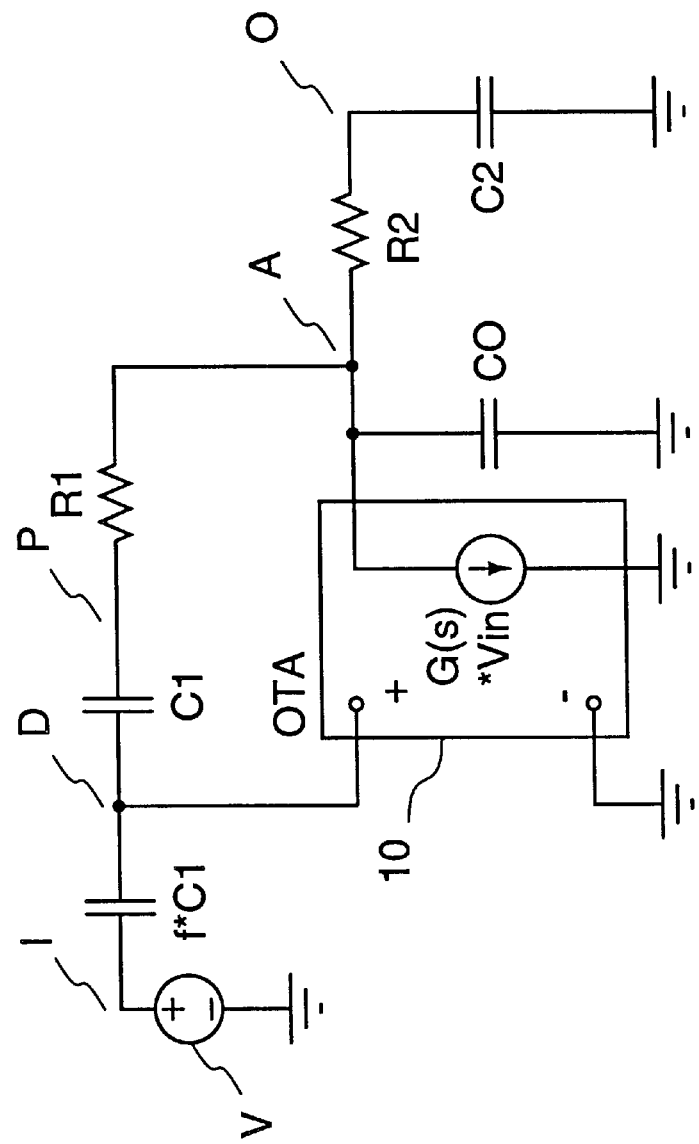
FIG. 7 illustrates an equivalent circuit of FIG. 6, including a corresponding input network and wherein appropriate switches are neglected.

If switches R1 and R2 are implemented only by NMOS transistors, the corresponding ratios of the switches are as follows:

$$\frac{R_1}{R_2} = \frac{(W_1/L_1)}{(W_2/L_2)}, \quad (1)$$

where W and L are the width and length of channels of the NMOS transistors forming the respective switches and $R_1$ and $R_2$ are the corresponding resistances of the switches. Neglecting resistances of switches R11 and R2A, capacitors CI, C11, C11B, C12 and C12B can be replaced by an input network consisting of a network including input voltage source V and capacitance elements ($f \times C1$) and C1 coupled serially between ground and the first end of resistor R1, as illustrated in FIG. 7. A node D between capacitance elements ($f \times C1$) and C1 is coupled to the non-inverted input of OTA 400. Also, capacitors C2B and C2C can be replaced by capacitor C2, which is coupled between the second end of resistor R2 at node O and ground.

The input voltage source V of FIG. 7 is introduced to model an initial condition in the settling process. In the real circuit topology of FIG. 6, the leftmost plate of capacitor C11 is previously charged with input voltage ($V_{F1}$) and at the beginning of the output-settling phase, the leftmost plate of capacitor C11 is short-circuited to ground. This is equivalent to assuming that, at t=0+ for the circuit shown in FIG. 7, the input voltage $v_1$ at input node I of the circuit is stepped from 0 to $V_F$ (that is a fraction of $V_{F1}$).

Next, the circuit of FIG. 7 is analyzed in the Laplace domain. The following notations are introduced:

$$\tau_1 = R_1 \times C_1 \frac{f}{1+f},$$

$$\tau_2 = R_2 \times C_2,$$

$$\Delta\tau_{12} = \tau_1 - \tau_2,$$

$$\tau = \frac{C_{L,TOT}}{G},$$

$$C_{L,TOT} = C_O + C_2 + C_1 \times \frac{f}{1+f},$$

$$a = \frac{C_2}{C_1},$$

$$b = \frac{C_O}{C_1},$$

$$p = \frac{\tau_1}{\tau}, \text{ and}$$

$$k = \frac{C_1}{C_{L,TOT}}.$$

In the above notations, the time constant $\tau$ has the units of time and can be regarded as the time constant of the system when the OTA is ideal (no parasitic poles) and the switch resistances are zero. The values R and C respectively represent resistance and capacitance of the corresponding resistors and capacitors. For example, $R_1$ represents the resistance of switch R1 and $C_1$ represents the capacitance of capacitor C1. Also, G is the transconductance of the OTA and is generally a function of frequency (or of s is the Laplace domain). If the OTA has singularities only at frequencies much higher than the ones of interest in this analysis, the transconductance G may be approximated with a constant real number. Using these notations, the Laplace transfer function $H(s)=V_o/V_1$, wherein $V_o$ is the voltage at node O and $V_1$ is the voltage at input node I of the circuit, can be analytically determined:

$$H(s) = \frac{V_O}{V_1} = -f \times \frac{1+(p-k+p/f)\tau s}{[1+(1+f)\tau s + bpk(f+1)\tau^2 s^2] \times (1+p\tau s) - \Delta\tau_{12} s \times \{1+[f+b(1+f)]\tau s + bpk(1+f)\tau^2 s^2\}}. \quad (2)$$

The settling within a reasonable accuracy (better than 6 . . . 7 bits) is determined mainly by the dominant pole of the transfer function. The value of this pole can be estimated by using a first order Padé approximation:

$$P_0 = -\frac{1}{(1+f)\tau - \Delta\tau_{12}}. \quad (3)$$

The migration of the dominant pole as a function of $\Delta\tau_{12}$ is because of the time constant mismatch ($\Delta\tau_{12} \neq 0$) that generates a pole-zero doublet. In order to determine more precisely the effect of the time constant mismatch, the unperturbed transfer function (for $\Delta\tau_{12}=0$) can be determined as:

$$(H_0(s) = H(s)|)_{\Delta\tau_{12}=0} = \quad (4)$$

$$-f \times \frac{1+(p-k+p/f)\tau s}{[1+(1+f)\tau s + bpk(f+1)\tau^2 s^2] \times (1+p\tau s)}.$$

A first order rational polynomial approximation for the error E(s) around s=0 can then be determined as:

$$E(s) = \frac{H(s)}{H_0(s)} - 1 = \frac{\Delta\tau_{12}s\{1+k[f+b(1+f)]\tau s\}}{[1+(1+f)\tau s] \times (1+p\tau s)}. \quad (5)$$

Now, the perturbed output error can be determined as the inverse Laplace transform of the $E(s) \times H_0(s)/s$ transfer function. From Eq. (5) it follows that $H=H_0+H_0E$. The response at the step function that models the settling phase is:

$$L^{-1}(H \times 1/s) = L^{-1}(H_0/s) + L^{-1}(H_0 \times E/s)$$

Usually the switch time constant is smaller than the OTA time constant and the parasitic load at the OTA output is smaller than the switched capacitance. In addition, the OTA transconductance is constant and a real number at the frequencies of interest for settling performance (i.e. single pole OTA approximation). In this case, the p and b values are small, $\tau$ is a real number and the settling error in the unperturbed case (no switch resistance) is:

$$y_0(\infty) - y_0(t) = -V_F \times f \times e^{-\frac{1}{(1+f)\tau}}. \quad (6)$$

The total settling error would then be:

$$y(\infty) - y(t) = -V_F \times f \times \left[1 - \frac{\Delta\tau_{12}}{\tau} \times \left(\alpha + \beta\frac{t}{\tau}\right)\right]e^{-\frac{t}{(1+f)\tau}}, \quad (7)$$

wherein:

$$\alpha = \frac{2f^2k^2}{(1+f)^3} \text{ and } \beta = \frac{f^2(1-k^2)+2f-1}{(1+f)^4}.$$

Based on the above analysis, the following may be concluded. First, the two settling errors can be made equal if the time constants of the load and the feedback switches are made equal as in Eq. (8), provided that the load switch time constant is smaller than the OTA time constant, as in Eq. (9):

$$\Delta\tau_{12}=0 \quad (8),$$

and $$p<(1+f) \quad (9)$$

In this case, the settling performance of the circuit with real switches is equal to the settling performance of the circuit with ideal switches. The transfer function for this case as in Eq. (10) shows that even for a more refined OTA model (higher order system approximation), the singularities of the ideal transfer function are preserved:

$$H(s) = -f \times \frac{1 + (p - k + p/f)\tau s}{[1 + (1 + f)\tau s] \times (1 + p\tau s)}. \quad (10)$$

The extra pole-zero doublet of Eq. (10) can be compensated by making $$k \sim p/f \quad (11)$$

or as translated into circuit element parameters:

$$R_1 \approx \frac{1+f}{G}. \quad (12)$$

This equation shows that, for a perfect pole-zero cancellation, the switch resistance must be matched with the inverse of the OTA transconductance. In this case, even an approximate cancellation suffices.

This allows for the following design procedure. First, design the OTA (multiple pole approximation) for optimal settling within the desired error in the ideal case (no switch resistance), then size the switches so that $\Delta\tau_{12}=0$ and $p<(1+f)$. This is equivalent to:

$$\frac{R_1}{R_2} = \frac{C_2}{C_1} \times \frac{1+f}{f}, \quad (13)$$

wherein:

$$G \times R_1 < (1 + f) \times \left[1 + \frac{f+1}{f}(a+b)\right], \quad (14)$$

and wherein for pole-zero doublet compensation:

$$G \times R_1 \sim (1+f) \quad (15)$$

If the switches are implemented using NMOS transistors with the same channel length, then the width ratio of the switches is given by $W_2/W_1 = R_1/R_2$. In a particular case where a=2, b=0 and f=1 (a typical case in a pipeline, switched-capacitor ADC), it follows that: $W_1/W_2=¼$ and $R_1<10/G$. In order to also compensate the high frequency pole-zero doublet at $-1/p\tau$, the condition $R_1 \sim 2/G$ can be added.

Accordingly, in the preferred design procedure, the switches are sized so that the time constant of the load switch and the time constant of the feedback switch are made equal, to improve settling. This is in contrast to conventional switched capacitor circuit design approaches, wherein switches are sized independently of each other and the time constants of the switches are generally neglected when designing the circuit. When comparing the preferred design procedure of the invention to the classical way of sizing the switches (i.e. $W_1/W_2=½$ in this particular case), the 7 bit accuracy settling time improvement of the preferred design procedure is larger than $2\tau$ for a single pole OTA model. This translates to a 20% increase of the sampling rate for a 7 bit ADC that employs this technique. When the OTA is compensated for optimal settling, the improvement is even better.

Figure 1:
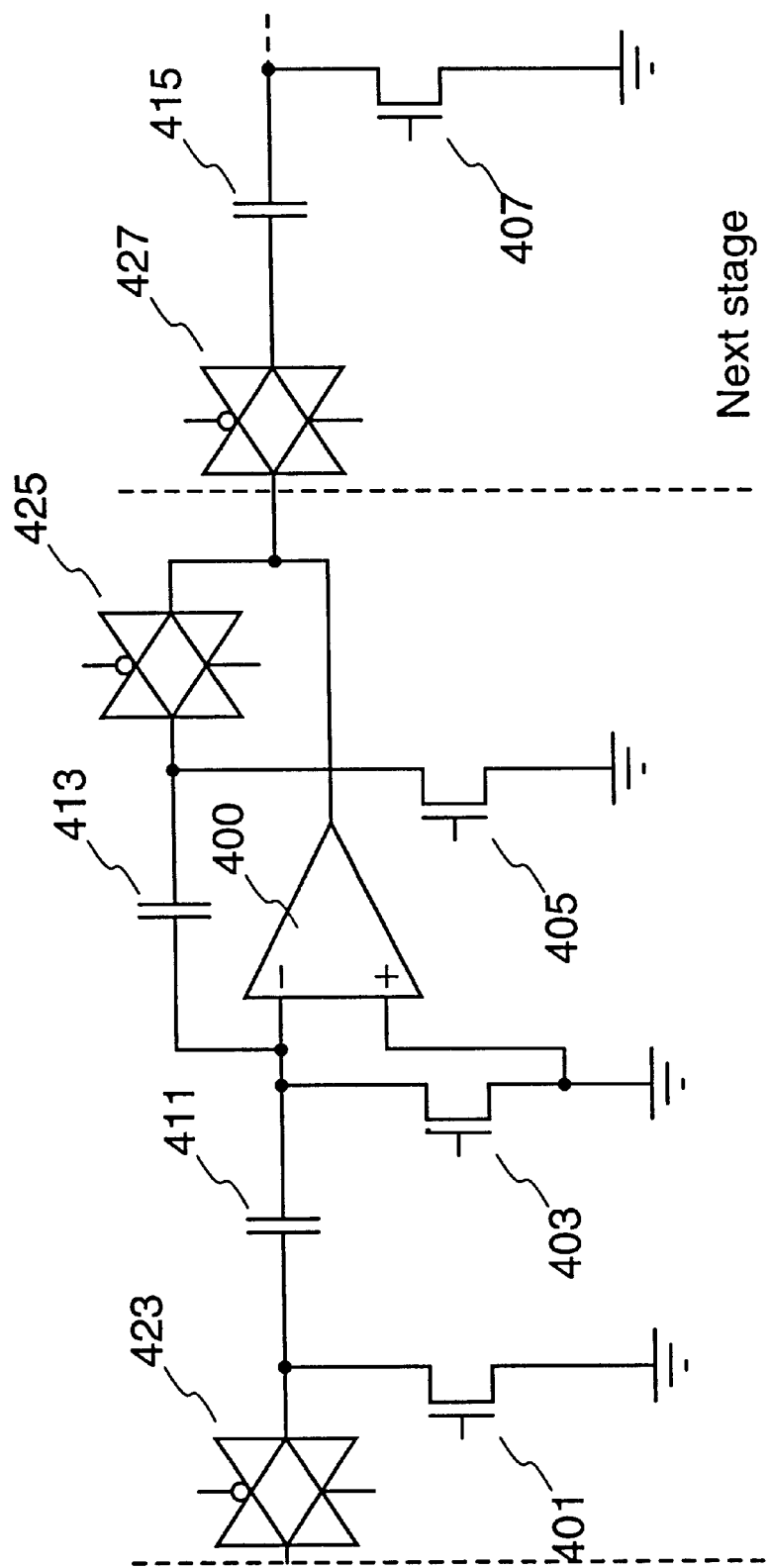
FIG. 1 illustrates a conventional switched-capacitor circuit including an operational transconductance amplifier.
Figure 1A:
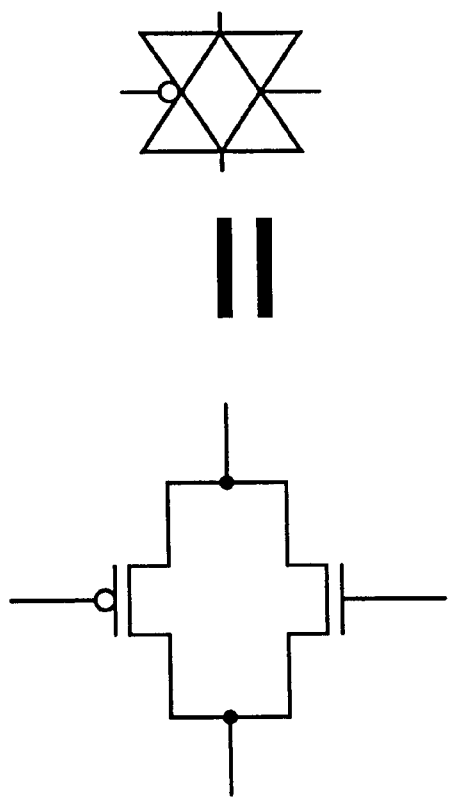
FIG. 1A illustrates the details of the CMOS switches of FIG. 1.
Figure 2:
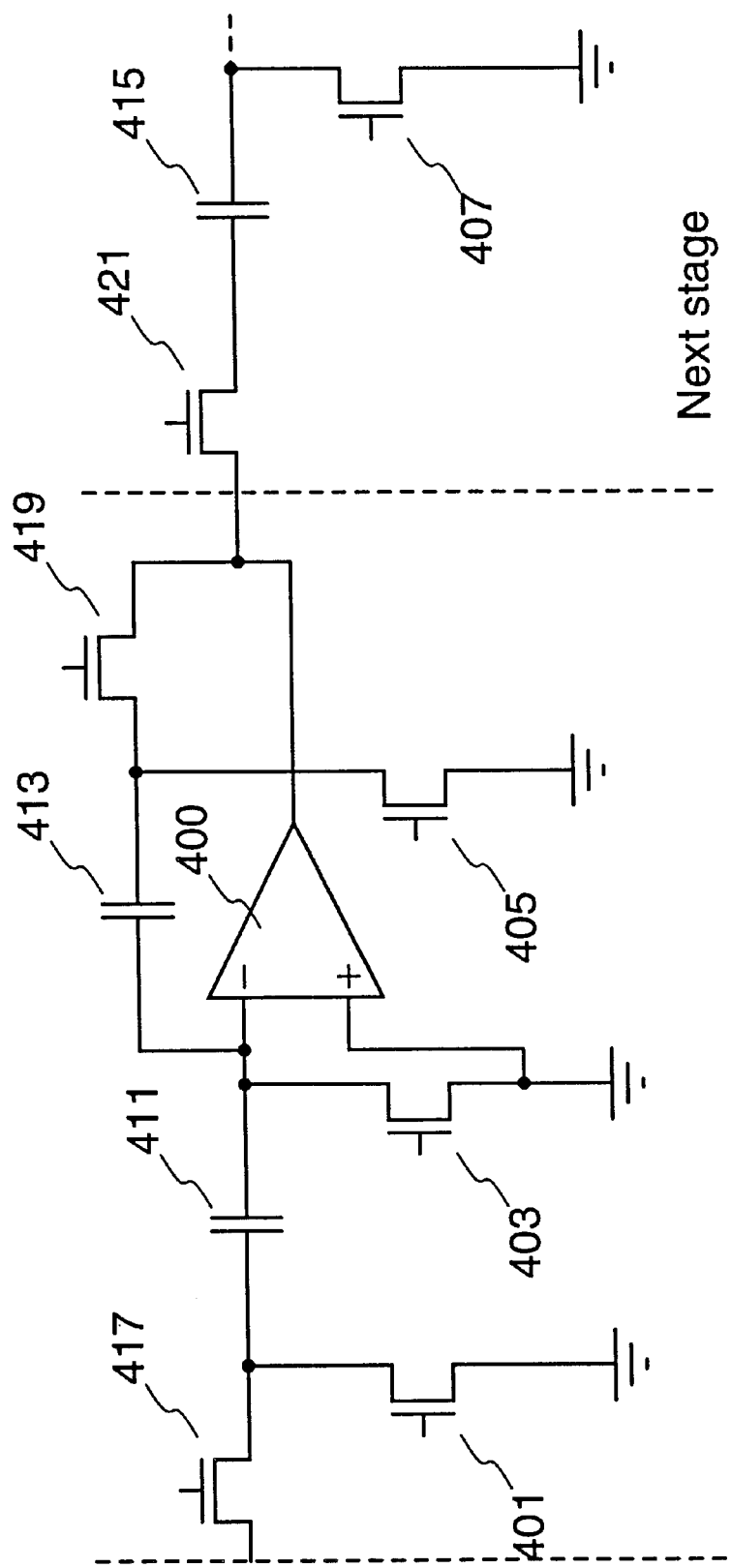
FIG. 2 illustrates the conventional switched-capacitor circuit of FIG. 1, wherein the corresponding CMOS transistors are replaced with NMOS transistors.
Figure 8A:
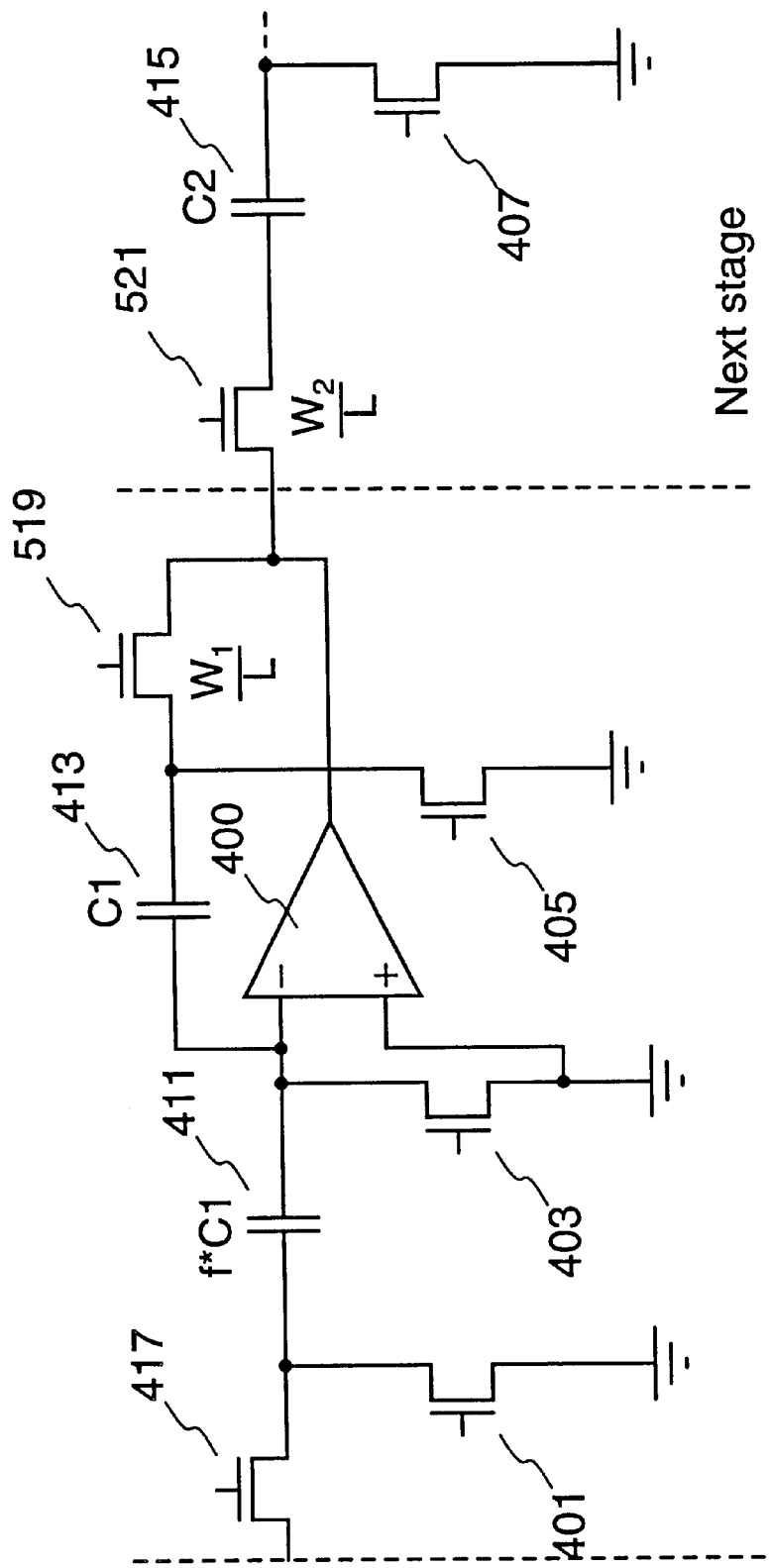
FIG. 8A illustrates a switched-capacitor circuit including feedback and load transistor switches sized in accordance with a preferred design procedure of the invention, to improve settling.

For example, FIG. 8A illustrates a sample and hold circuit with gain that is similar to the circuit of FIG. 2, with the only difference being that feedback switch 419 and load switch 421 of FIG. 2 are respectively replaced in FIG. 8A with feedback switch 519 and load switch 521, which are optimally sized as described with respect to the preferred design procedure, to improve settling. Specifically, the widths of the switches 519 and 521 are given as:

$$\frac{W_2}{W_1} = \frac{C_2}{C_1} \times \frac{1+f}{f}. \quad (16)$$

Figure 8B:
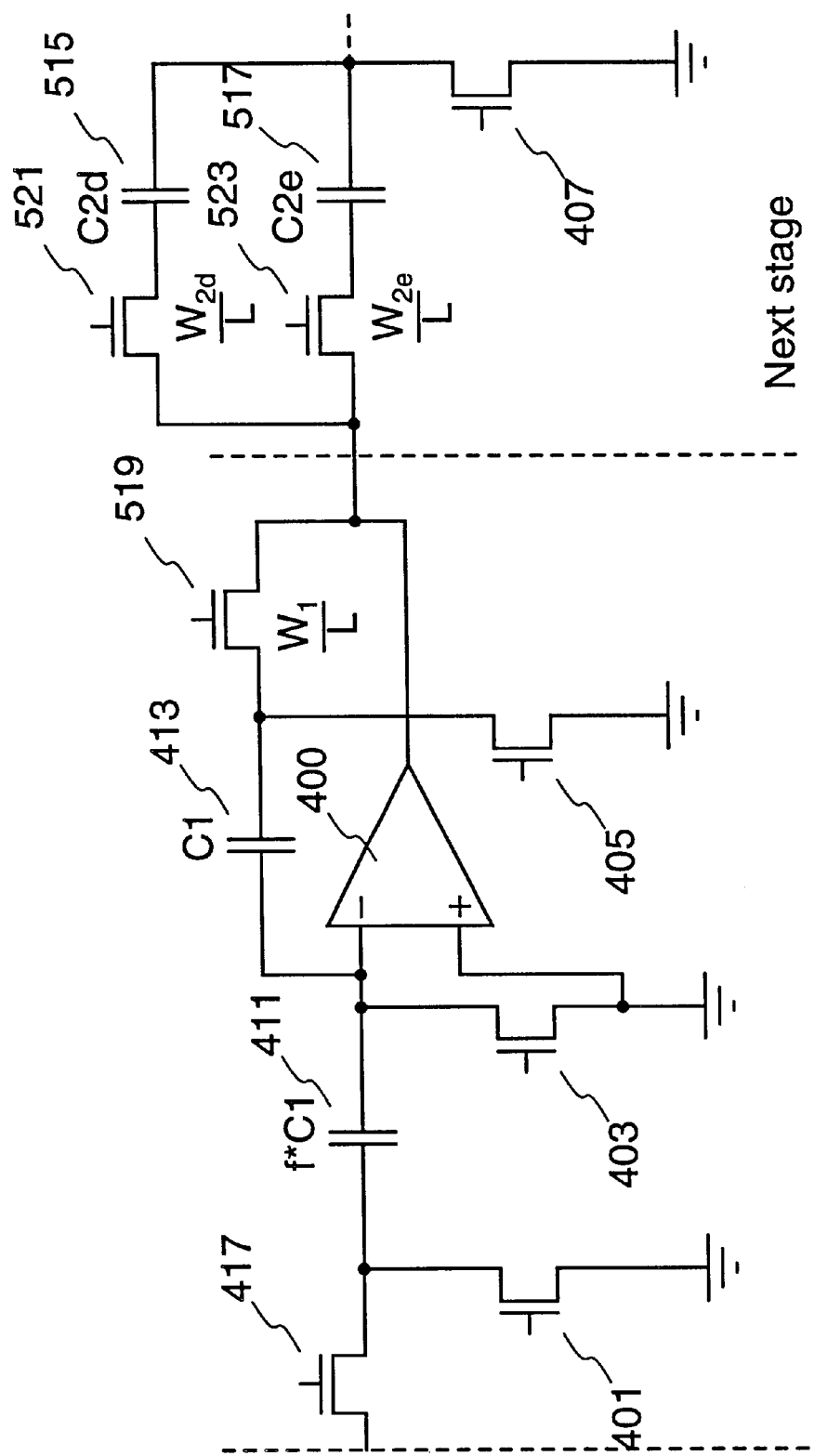
FIG. 8B illustrates a switched-capacitor circuit including a feedback transistor switch and a plurality of parallel connected load transistor switches sized in accordance with the preferred design procedure of the invention, to improve settling.

The circuit of FIG. 8A includes only a single capacitor 415 in the load stage. In a variation of the circuit of FIG. 8A, the load stage in the circuit of FIG. 8B includes two parallel capacitors 515 and 517. Each of capacitors 515 and 517 are coupled to the output node of OTA 400 via respective load switches 521 and 523. The remainder of the circuit of FIG. 8B is similarly configured as in FIG. 8A. Load switches 521 and 523 are sized in accordance with the preferred design procedure so that for each of load capacitors 515 and 517, the time constants of the both load branches are set equal to $\tau_2$ and $\Delta\tau_{12}=0$, in order to improve settling. The widths $W_{2d}$ and $W_{2e}$ of load switches 521 and 528 are set as:

$$W_2 = W_{2d} + W_{2e} \quad (17),$$

wherein $$C_{2d} \times W_{2e} = C_{2e} \times W_{2d} \quad (18)$$

Figure 5:
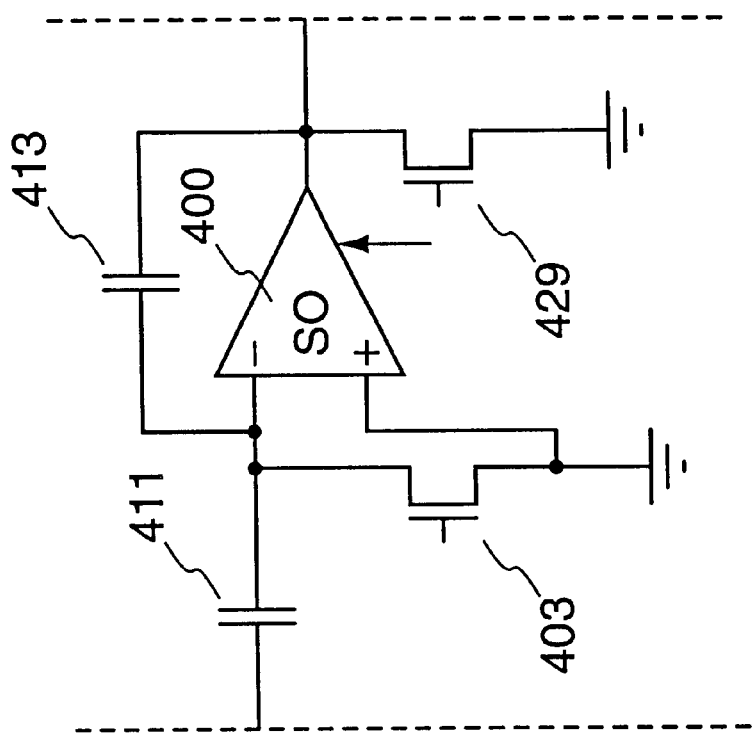
FIG. 5 illustrates a conventional switched-capacitor circuit including an operational transconductance amplifier having a cut output stage.

The sizing principles of the preferred design procedure can be applied to improve settling of conventional switched-capacitor circuits that do not include a feedback switch in the feedback stage. For example, a conventional switched-capacitor integrator such as illustrated in FIG. 5 of the Gregorian et al. publication does not include a corresponding feedback switch in the feedback stage. The capacitor in the feedback stage is directly coupled to the output of the corresponding OTA.

Figure 9A:
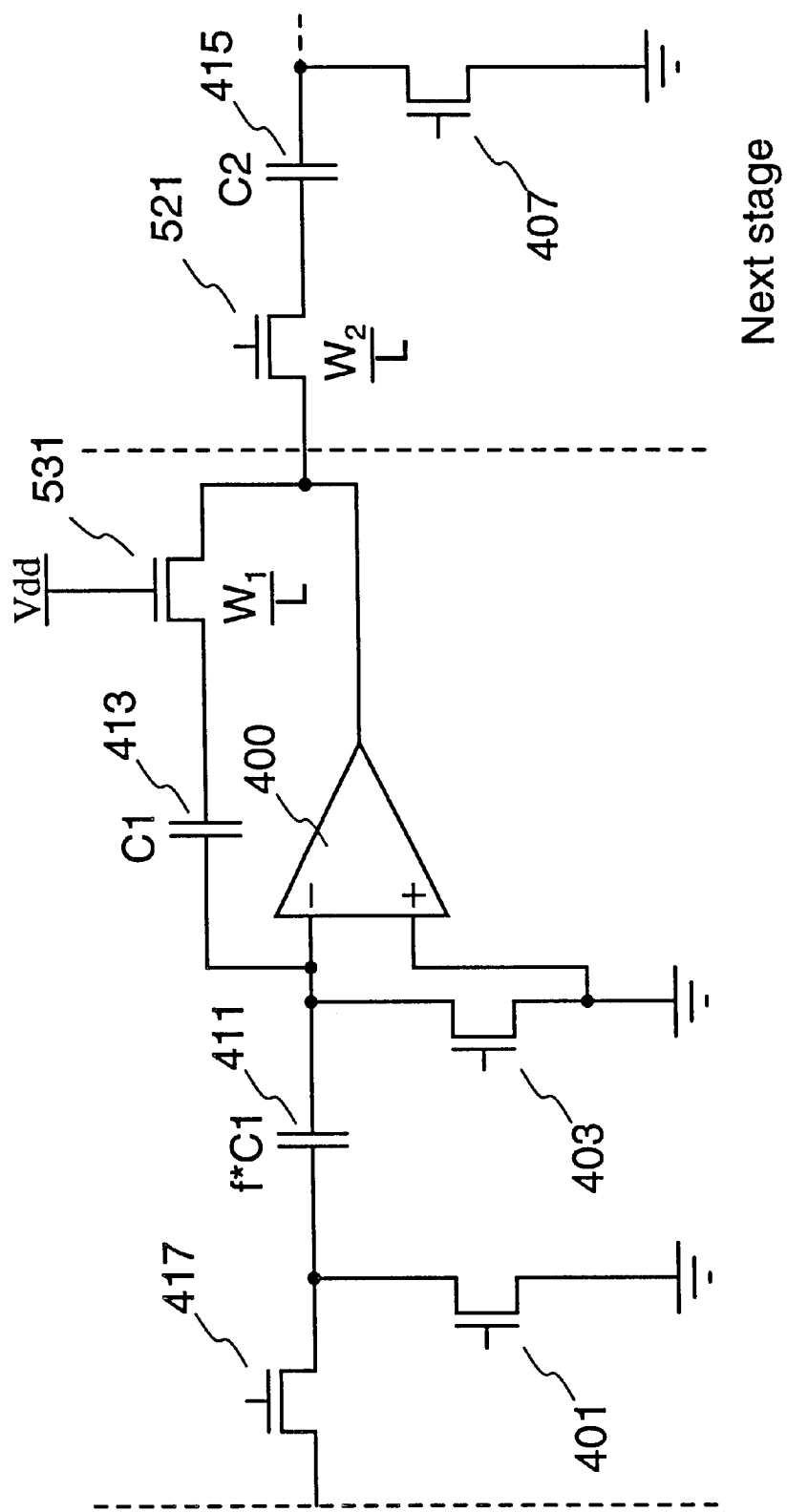
FIG. 9A illustrates a switched-capacitor integrator circuit of a preferred embodiment including an inserted feedback dummy transistor switch and a load transistor switch sized in accordance with the preferred design procedure of the invention, to improve settling.

Accordingly, in a further preferred embodiment of the present invention as illustrated in FIG. 9A, a switched-capacitor integrator such as illustrated in FIG. 5 of the Gregorian et al. publication is configured as including a dummy transistor 531 that is inserted into the feedback stage of the circuit and that includes a gate tied directly to voltage supply Vdd, so that dummy transistor 531 is always in an on state. Dummy transistor 531 is inserted into the feedback stage to connect node capacitor C1 to the OTA output node and is inserted to account for time constant matching. The dummy transistor 531 and load transistor 521 are sized as described above with reference to FIG. 8A.

Accordingly, a conventional switched-capacitor integrator that typically does not include a feedback switch, may be modified to include a dummy transistor inserted in the feedback stage, so that the preferred design procedures of the invention may be applied to improve settling. Incidentally, the remaining elements of FIG. 9A are configured similarly as in the circuit of FIG. 2, except for NMOS transistors 405 and 419 that are not included in FIG. 9A.

The sizing principles of the preferred design procedure can also be applied to improve settling of compound switched-capacitor circuits. For instance, FIGS. 8–37(c) of the Laker et al. publication illustrates a conventional compound switched-capacitor circuit configured as a low pass filter, having a feedback stage including a first feedback loop consisting of a capacitor in series with a feedback switch and including a second feedback loop consisting of a capacitor without a series connected feedback switch. In a further preferred embodiment of the invention as illustrated in FIG.

9B, a switched-capacitor low pass filter is configured using the sizing principles of the preferred design procedure.

Figure 9B:
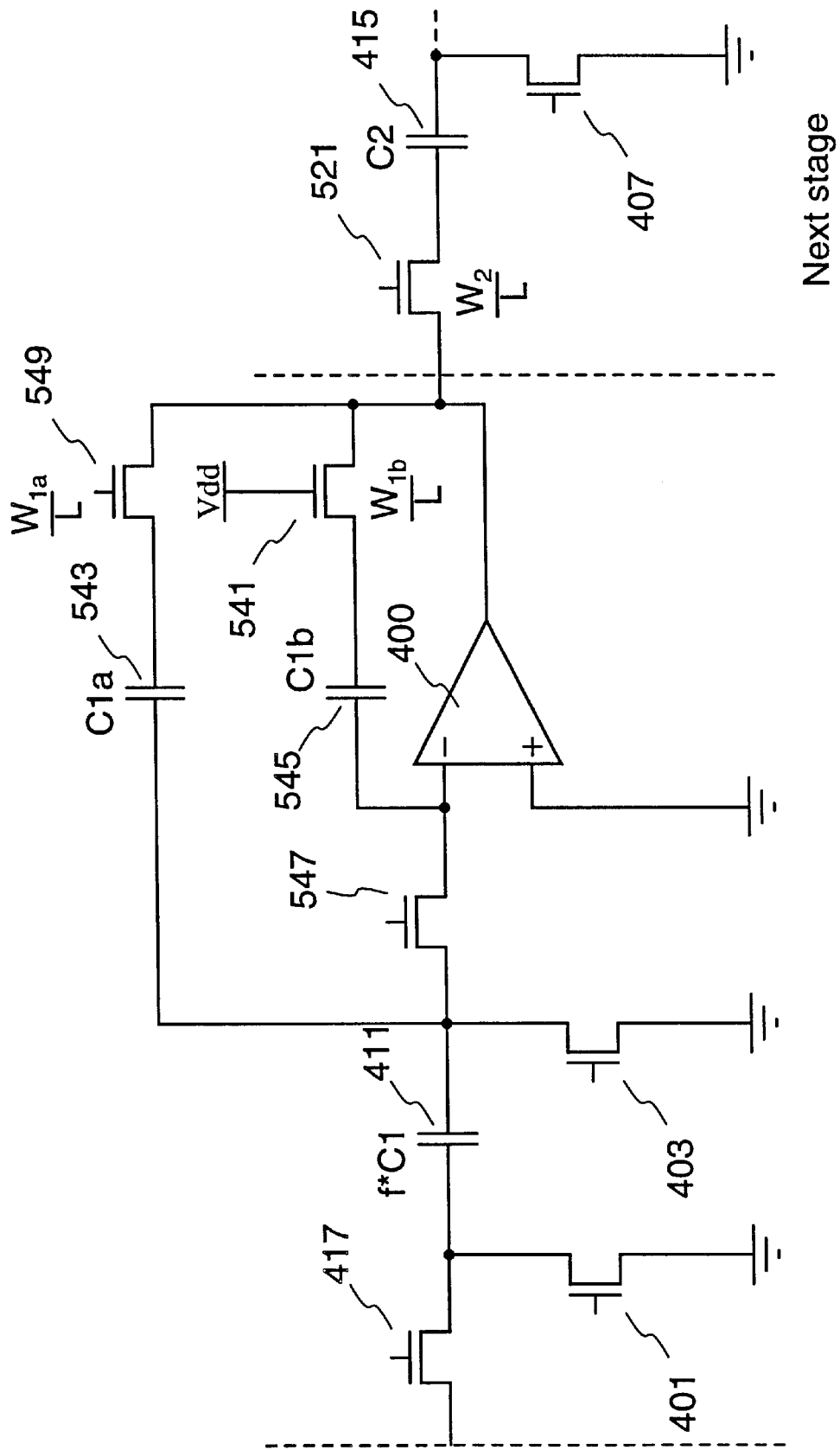
FIG. 9B illustrates a compound switched-capacitor circuit of a preferred embodiment configured as a low pass filter and including at least one of first and second feedback loops having an inserted feedback dummy transistor switch, to improve settling.

The circuit of FIG. 9B has multiple feedback loops including a first feedback loop consisting of capacitor 543 coupled in series with feedback switch 549. Capacitor 543 includes a first plate coupled to the inverting input of OTA 400 via NMOS transistor 547 and a second plate coupled to a first end of NMOS feedback switch 549. A second end of feedback switch 549 is coupled to the output of OTA 400. Feedback switch 549 is sized in accordance with the preferred design procedures as described previously. This first feedback loop of FIG. 9B corresponds to the first feedback loop of the above-noted conventional compound switched-capacitor circuit that includes a capacitor in series connection with the feedback switch.

The second feedback loop of the switch-capacitor low pass filter of FIG. 9B corresponds to the second feedback loop of the above-noted conventional compound switched-capacitor circuit that includes a capacitor without a series connected feedback switch, i.e. the capacitor is directly connected to the output of OTA 400. In this second feedback loop of FIG. 9B, a dummy transistor 541 is inserted as connected in series with capacitor 545. Capacitor 545 includes a first plate connected to the inverting input of OTA 400 and a second plate coupled to a first end of dummy switch 541. A second end of dummy switch 541 is coupled to the output of OTA 400. The remaining circuit elements are configured similarly as in FIG. 9A, except that the non-inverting input of OTA 400 is coupled directly to ground and also is not directly tied to the second end of NMOS transistor 403.

Load switch 521, feedback switch 549 and dummy switch 541 are sized based on the sizing principles of the preferred design procedure to improve settling. In order to ensure that the feedback network has one pole behavior with a time constant equal to the load time constant, dummy switch 541 is inserted as described. The time constants of both the first and second feedback loops must have the same value to ensure that the network maintains single pole system behavior. Thus, the following relation must hold:

$$R_{1a} \times C_{1a} = R_{1b} \times C_{1b} \quad (19)$$

such that the feedback network of FIG. 9B may be considered as equivalent to the feedback network of FIGS. 6 and 7. The equivalent parameter values of the feedback network of FIG. 9B may thus be given as follows:

$$R_1 = \frac{R_{1a} \times R_{1b}}{R_{1a} + R_{1b}} \text{ and} \quad (20)$$

$$C_1 = C_{1a} + C_{1b} \quad (21)$$

Consequently, the width of the switches are determined as follows:

$$W_1 = W_{1a} + W_{1b} \quad (22),$$

wherein $$C_{1a} \times W_{1b} = C_{1b} \times W_{1a} \quad (23)$$

Thus, width $W_1$, and hence widths $W_{1a}$ and $W_{1b}$, may be determined using the sizing principles of the preferred design procedure, to improve settling performance. It is to be understood that in the above analysis, $R_{1a}$ and $R_{1b}$ represent the resistance of switches 549 and 541 respectively, $R_1$ represents the equivalent resistance of the feedback network, $C_1$ represents the equivalent capacitance of the feedback network and $W_1$ represents the width of an equivalent MOS transistor switch of the feedback network.

Also based on the previous analysis, the following may be concluded. Assuming that the OTA is sized so that it can be approximated by a one pole model, the settling error can be further improved by making $\Delta\tau_{12} > 0$. However, the $\Delta\tau_{12}$ and $\tau$ values have to track across the operating condition of the OTA in order to maintain the error smaller. The optimum value for $r = \Delta\tau_{12}/\tau$ can be numerically determined as a function of the desired settling error. For example, if a 7 bit accuracy is needed for $a=2$, $b=0$, $k=0.4$ and $f=1$, the settling time $t_S$ is given by the following implicit equation:

$$\frac{1}{2^{7+1}} = \left[1 - r \times \left(0.040 + 0.115 \frac{t_S}{\tau}\right)\right] e^{-\frac{t_S}{2\tau}}. \quad (24)$$

An optimal value for r that minimizes $t_S/\tau$ can be determined and, using this value, the switch resistance can also be determined. In general, the optimal value $r_{opt} > 0$. In this particular case $r_{opt} = 1.25$ and $t_S/(2\tau) = 3.02$, compared to $t_S/(2\tau)_0 = 5.55$ for $\Delta\tau_{12} = 0$ and a single dominant pole for the OTA. The relation between $R_1$ and $R_2$ becomes $R_1 - 4R_2 = 7.5/G$. One of the solutions is to have $R_2 = 0.5/G$ and $R_1 = 9.5/G = 19R_2$. Thus, in accordance with a second preferred design procedure, optimal settling can be further improved if the difference between the respective time constants is greater than zero. This is done by controlling $R_1$ and $R_2$ with respect to G.

Generally, if the resistances of the feedback switch and the load switch are made to track the value of 1/G (the inverse of the OTA transconductance), optimal transfer function with respect to settling based on both OTA and switch related singularities may be obtained. In this case, a good model for the OTA including all singularities at the frequencies of interest and values for the feedback and load capacitances are needed. The optimal settling problem thus becomes a problem of optimizing the settling time with respect to the width of the feedback and load switches.

For instance, assuming that the resistance of the feedback and load switches are respectively $R_1$ and $R_2$ and that the resistances remain constant, if G is increased by variation of an OTA bias current for example, the frequency of the dominant pole is modified and the frequency of the poles that are due to switches will remain constant, i.e. do not scale with variation of G. If in a first case the system was optimally compensated with respect to settling, it may happen that in a second case with increased G, overshoot occurs resulting in a settling time much worse than the optimal settling time. Thus, switch resistance must be tracked with the inverse of the OTA transconductance across temperature, voltage and technology variations.

Figure 10:
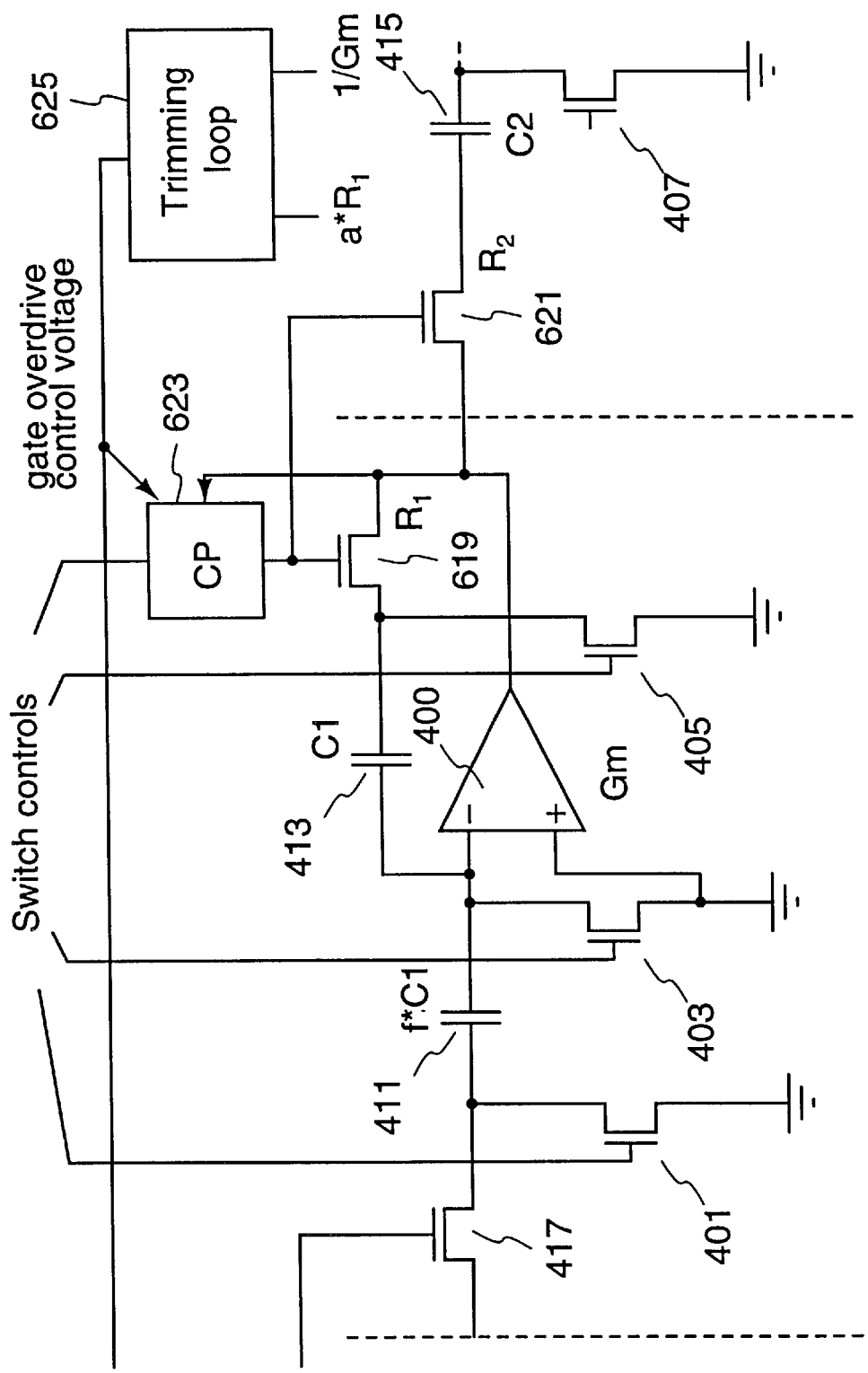
FIG. 10 illustrates a switched-capacitor circuit of a preferred embodiment having a resistance-transconductance configuration with a trimming loop for controlling gate overdrive voltage.
Figure 11:
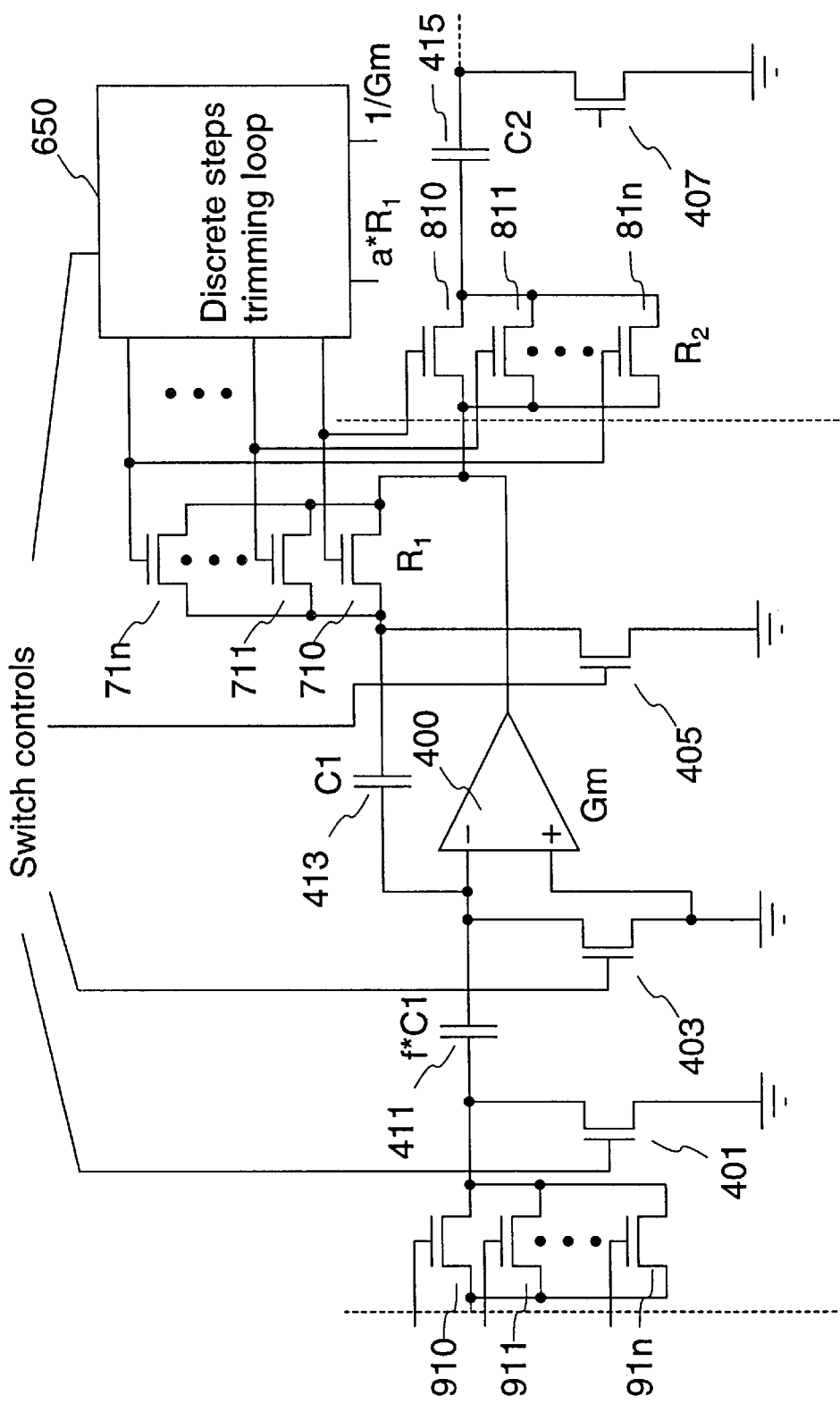
FIG. 11 illustrates a switched-capacitor circuit of a preferred embodiment having a resistance-transconductance configuration with respective parallel connected feedback transistor switches and load transistor switches controlled by a discrete steps trimming loop.

This resistance-transconductance configuration of the further embodiment can be obtained using a trimming loop. In one embodiment, the trimming loop can control the gate overdrive voltage as illustrated in FIG. 10. Another possibility is shown in FIG. 11, wherein the switch resistances are trimmed in discrete steps by connecting in parallel many switches. For a certain trimming step, only a fraction of the transistors are used for switching, the others are off all the time.

In greater detail, the circuits of FIGS. 10 and 11 demonstrate how transconductance G may be tracked with the feedback and load switch resistance. The switch resistance may be modified by varying switch overdrive voltage or by switching ON/OFF some of the transistors that are part of a mesh of connected switches of the feedback and load networks, and also by any combination of both techniques.

The switched-capacitor circuit of FIG. 10 is configured similarly as the circuit of FIG. 2, except that feedback and load switches 419 and 421 of FIG. 2 are replaced by feedback and load switches 619 and 621, wherein $R_1$ and $R_2$ in FIG. 10 respectively represent the resistance of switches 619 and 621. In the switched-capacitor circuit of FIG. 10, the gates of feedback and load switches 619 and 621 are controlled by charge pump 623. This is in contrast to conventional switched-capacitor circuits wherein the gates of feedback and load switches are typically controlled by a digital buffer. In FIG. 10, the output of OTA 400 is provided as an input to charge pump 623, which keeps the respective gate-source voltages of switches 619 and 621 constant, irrespective of the output voltage at the output node of the OTA. As a consequence, the series resistances (neglecting the body effect) of the switches are maintained constant in the on-state. The gate over-drive control voltage as provided to charge pump 623 is varied by trimming loop 625 in such a way as to be proportional to the inverse of the OTA transconductance. Trimming loop 625 measures the value of a matched switch and the value of a matched transconductance (or operational amplifier) and controls the overdrive voltages of switches 619 and 621 to minimize the difference between the two measured resistances.

In greater detail, charge pump 623 is in a general class of circuits, and is capable of boosting a supplied voltage level to provide an output voltage having a level greater than the supplied voltage level. An example of such a circuit would be a conventional bootstrap circuit or the like. Bootstrap techniques are typically used to boost the clocks of NMOS integrated circuits, for example.

The values of 1/Gm and $R_1$ as provided to trimming loops 625 and 650 in FIGS. 10 and 11 can be obtained in a variety of ways, as would be understood by one of ordinary skill. For example, using the replica principle, a switch or device matching the characteristics of switch 619 for instance, and an operational amplifier or device matching the characteristics of OTA 400, may be provided. A known current may be injected into the replica switch, and using the voltage across the replica switch, the resistance $R_1$ may be obtained and provided to trimming loops 625 and 650 of FIGS. 10 and 11. In a similar manner, in order to measure transconductance, the replica OTA may be coupled as having feedback, such as to present at the output an impedance equal to 1/Gm. This output resistance can be measured using conventional methods for measuring resistance, such as disclosed in the Laker et al. publication.

An example of how trimming loop 625 operates is now described, assuming that information $R_1$ and 1/Gm input to trimming loop 625 are represented as respective voltages. For example, if the voltage representing resistance $R_1$ of switch 619 is larger than the voltage representing 1/Gm of OTA 400, the gate overdrive control voltage provided from trimming loop 625 to charge pump 623 is increased. As a consequence, the switch gate overdrive voltage provided from charge pumps 623 to switches 619 and 621 are increased. The replica switch that is replica biased (same gate overdrive voltage as the active switches), will thus have a smaller resistance. This process corresponds to a negative feedback operation that settles the charge pump control voltage to such a value that $R_1$ equals 1/Gm. Incidentally, trimming loop 625 must be designed to be stable so as not to oscillate. Also, it is understood that although trimming loop 625 may provide the gate overdrive control voltage so that $R_1$ is made equal to 1/Gm in a preferred embodiment, $R_1$ may be made to merely have a specific relationship with respect to 1/Gm in an alternative embodiment, by setting constant a to some value other than 1.

The switched-capacitor circuit of FIG. 11 is configured similarly as the circuit of FIG. 2, except that the feedback switch 419 and the load switch 421 of FIG. 2 have been respectively replaced by a plurality of parallel connected switches. Also, NMOS switch 417 in FIG. 2 has been replaced a plurality of respective parallel connected switches. The switches are intended to include any type or network of switches wherein equivalent resistance of the network can be varied by switching the switches on or off. In FIG. 11, the feedback switch network consists of parallel coupled feedback switches 710, 711, . . . 71n connected between the second plate of capacitor 413 and the output of OTA 400. The gate voltages of the feedback switches are controlled by discrete steps trimming loop 650. Similarly, the load switch network consists of a plurality of parallel coupled load switches 810, 811 . . . 81n connected between the output of OTA 400 and the first plate of capacitor 415. The gate voltages of the load switches are likewise controlled by discrete steps trimming loop 650. The equivalent on-state resistances $R_1$ and/or $R_2$ of the feedback switches and the load switches can be increased or decreased by selectively turning on either more or less of the parallel switches. The number of switches that are turned on is controlled by discrete steps trimming loop 650 in such a way so that the equivalent switch resistances $R_1$ and $R_2$ are made proportional to the inverse of the OTA transconductance. Incidentally, the switch network including parallel coupled switches 910, 911 . . . 91n that replaces NMOS transistor 417 is controlled by a corresponding discrete steps trimming loop of a previous circuit stage.

Similarly as described with respect to FIG. 10, discrete steps trimming loop 650 measures the resistance of a matched switch and the value of a matched transconductance and controls the number of switches that are to be turned on, in order to minimize the difference between the two measured equivalent resistances a *$R_1$ and Gm. The only difference is the way in which the switch resistance is varied, i.e. by connecting or disconnecting parallel switches to insure proper switch impedance. For example, switch resistance is increased by turning off more transistors and is reduced by turning on more transistors. Discrete steps trimming loop 650 sends switch signals only to turn on transistors to be active, all other transistors not provided with a switch signal are off or inactive.

If the voltage representing resistance $R_1$ of switch 71n as provided to discrete steps trimming loop 650 is smaller than the voltage representing 1/Gm, the equivalent switch resistance must increased. This is accomplished by turning off a currently active switch. On the other hand, if the voltage representing resistance $R_1$ of switch 71n is larger than the voltage representing 1/Gm, the equivalent switch resistance must be decreased. This is accomplished by turning on a currently inactive switch.

Incidently, in each of the circuits of FIGS. 10 and 11, only one trimming loop is necessary. This is so because when one switch resistance is matched with a transconductance, the remainder of the circuit may be directly scaled starting from these particular resistance and transconductance values. For example, if twice as much transconductance is needed two transconductance units and twice as many switches may be respectively connected in parallel.

As described above in accordance with the preferred design procedure of the first embodiment, settling time is improved based on matching different time constants related to switch series resistance, so that the total effect at the OTA output is canceled out. The corresponding analysis demonstrates that a better (shorter) settling time is obtainable by matching the time constant of the switch-capacitor from the OTA feedback loop to the time constant of the switch-capacitor from the OTA load section. In order to match the two time constants, the dominant MOS switches (feedback and load) are connected to the same node ensuring the same switch gate overdrive voltage. Fortunately, this is the case for most switched capacitors circuits. When a switch that connects the feedback network to the output (e.g. lossless switched capacitor integrator) is not included, a dummy MOS switch that accounts for time constant matching may be used. This switch must be connected to the same node as the load switch. The feedback and load time constant matching thus enables the use of the internal OTA poles for optimal settling.

As described above in accordance with a further second embodiment, the two time constants can be designed to generate the optimum settling pole configuration together with the OTA poles. This can be achieved if the switch on-resistance is controlled (by gate overdrive voltage or resistance switching). A loop senses directly or indirectly (by replica principle) the OTA transconductance and tunes the switch on-resistance to make the product of the two constant.

In accordance with the embodiments of the invention, the effect of the output switch time constant is compensated by the feedback switch time constant even if the value of these time constants approaches the value of the OTA-C time constant. This enables higher dynamic range and/or higher speed when an all-NMOS implementation is used. By applying the above described sizing principles, circuits based on the classical approaches can also function up to higher frequencies (by scaling both N and P transistor widths using the same ratio). In particular, an improvement of 20% in sampling frequency of a 7 bit pipeline ADC can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A circuit comprising:
   an operational transconductance amplifier, having an input terminal and an output terminal, that amplifies a signal provided at the input terminal and provides an amplified signal at the output terminal;
   a feedback section that provides a feedback signal to the input terminal based on the amplified signal, said feedback section including a first switched capacitor and having a first time constant; and
   a load section that provides the amplified signal as an output of the circuit, said load section including a second switched capacitor and having a second time constant, the first time constant matching the second time constant to improve settling of the circuit,
      said feedback section including a dummy transistor that is in an always-on state and that is inserted into said feedback section to couple the first switched capacitor to the output terminal of said operational transconductance amplifier.

2. The circuit of claim 1, wherein the first and second time constants are switch related time constants.

3. The circuit of claim 1, wherein said feedback section comprises the first switched capacitor coupled in series with a first transistor having an on resistance $R_1$ and a channel width $W_1$ and said load section comprises the second switched capacitor coupled in series with a second transistor having an on resistance $R_2$ and a channel width $W2$, channel lengths of the first and second transistors being the same and $W_2/W_1$ being equal to $R_1/R_2$ so that the first and second time constants match.

4. The circuit of claim 3, wherein the first and second transistors are NMOS transistors.

5. The circuit of claim 1, wherein said load section includes a transistor that couples the second switched capacitor to the output terminal of said operational transconductance amplifier.

6. The circuit of claim 5, wherein the dummy transistor and the transistor are NMOS transistors that are sized so that the first time constant and the second time constant are matched.

7. A circuit comprising:
   an operational transconductance amplifier, having an input terminal and an output terminal, that amplifies a signal provided at the input terminal and provides an amplified signal at the output terminal;
   a feedback section that provides a feedback signal to the input terminal based on the amplified signal, said feedback section including a first switched capacitor and having a first time constant; and
   a load section that provides the amplified signal as an output of the circuit, said load section including a second switched capacitor and having a second time constant, the first time constant matching the second time constant to improve settling of the circuit,
      said load section comprising a plurality of parallel connected second switched capacitors that are coupled to the output terminal of said operational transconductance amplifier by respective transistors.

8. The circuit of claim 7, wherein the first and second switched capacitors are coupled to the output terminal of said operational transconductance amplifier by respective transistors,
   channel widths and lengths of the transistors being sized so that the first time constant and the second time constant are matched.

9. The circuit of claim 7, wherein the transistors are NMOS transistors.

10. A method of improving settling of a circuit including an operational transconductance amplifier, a feedback stage having a first switched capacitor and a load stage having a second switched capacitor, comprising:
   matching a time constant of the feedback stage and a time constant of the load stage,
      the matching comprising inserting a dummy transistor that is in an always-on state into the feedback section to couple the first switched capacitor to the output of the operational transconductance amplifier.

11. The method of improving settling of claim settling of claim 10, wherein the time constant of the feedback stage and the time constant of the load stage are switch related time constants.

12. The method of improving settling of claim 10, wherein the load section includes a transistor that couples the second switched capacitor to an output of the operational transconductance amplifier, the matching further comprising:
   providing the dummy transistor and the transistor as having channel widths and lengths that are sized so that the first and second time constants are matched.

13. The method of improving settling of claim 12, wherein the dummy transistor and the transistor are NMOS transistors.

14. The method of improving settling of claim 10, wherein the first and second switched capacitors are coupled to an output of the operational transconductance amplifier by respective first and second transistors, the matching comprising providing the first and second transistors as having channel widths and lengths that are sized so that the first and second time constants are matched.

15. The method of improving settling of claim 14, wherein the first and second transistors are NMOS transistors.

16. A circuit comprising:

an operational transconductance amplifier, having an input terminal and an output terminal, that amplifies a signal provided at the input terminal and provides an amplified signal at the output terminal;

a feedback section that provides a feedback signal to the input terminal based on the amplified signal, said feedback section including a first switched capacitor and having a first time constant; and a load section that provides the amplified signal as an output of the circuit, said load section including a second switched capacitor and having a second time constant, the first time constant being greater than the second time constant to improve settling of the circuit.

17. The circuit of claim 16, wherein the first and second switched capacitors are coupled to the output terminal of said operational transconductance amplifier by respective transistors, resistance of the transistors in an on-state being controlled based on transconductance of said operational transconductance amplifier.

18. The circuit of claim 17, further comprising a gate voltage controller that provides gate voltages to gates of the transistors based on the transconductance of said operational transconductance amplifier, to control on-state resistance of the transistors.

19. The circuit of claim 18, wherein said gate voltage controller comprises:

a charge pump, coupled to the output terminal of said operational transconductance amplifier, that provides constant gate voltages to the transistors; and a trimming loop that controls said charge pump to provide the constant gate voltages at a selected level, based on the transconductance of said operational transconductance amplifier.

20. The circuit of claim 19, wherein said charge pump maintains the constant gate voltages at the selected level as a voltage level of the amplified signal at the output terminal of said operational transconductance amplifier varies.

21. The circuit of claim 20, wherein the transistors are NMOS transistors.

22. The circuit of claim 18, wherein said feedback section includes a plurality of parallel connected first transistors coupled between the first switched capacitor and the output terminal of said operational transconductance amplifier and said load section includes a plurality of parallel connected second transistors coupled between the second switched capacitor and the output terminal of said operational transconductance amplifier, said gate voltage controller comprising:

a discrete steps trimming loop that provides plural gate voltages to selectively switch the first and second transistors on and off based on the transconductance of said operational transconductance amplifier, to control on-state resistance of the first and second transistors so that the first time constant is greater than the second time constant.

23. The circuit of claim 23, wherein the first and second transistors are NMOS transistors.

* * * * *